(12) United States Patent
Yu et al.

(10) Patent No.: US 6,472,266 B1
(45) Date of Patent: Oct. 29, 2002

(54) METHOD TO REDUCE BIT LINE CAPACITANCE IN CUB DRAMS

(75) Inventors: Chih-Hsing Yu, Hsin-Chu (TW); Yu-Shen Chen, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/882,427

(22) Filed: Jun. 18, 2001

(51) Int. Cl.⁷ .................................. H01L 21/8242
(52) U.S. Cl. .................. 438/241; 438/253; 438/396; 257/300
(58) Field of Search ................ 438/241, 253, 438/396; 257/300

(56) References Cited

U.S. PATENT DOCUMENTS

| | | | |
|---|---|---|---|
| 6,074,908 A | 6/2000 | Huang | 438/241 |
| 6,110,775 A | 8/2000 | Fujii et al. | 438/254 |
| 6,140,200 A | 10/2000 | Eldridge | 438/396 |
| 6,165,839 A | 12/2000 | Lee et al. | 438/253 |
| 6,168,989 B1 | 1/2001 | Chiang et al. | 438/253 |
| 6,229,174 B1 * | 5/2001 | Parekh | 257/306 |
| 6,300,667 B1 * | 10/2001 | Miyamoto | 257/522 |
| 2001/0044181 A1 * | 11/2001 | Nakamura | 438/253 |
| 2001/0045658 A1 * | 11/2001 | Deboer et al. | 23/48 |

* cited by examiner

Primary Examiner—Carl Whitehead, Jr.
Assistant Examiner—Jeff Vockrodt
(74) Attorney, Agent, or Firm—George O. Saile; Stephen B. Ackerman (57) ABSTRACT

A new method is provided for the creation of the bit line contact plug. CUB capacitors typically are located adjacent to the bit line contact plug, a parasitic capacitance therefore exists between the CUB and the contact plug. Typical interface between the CUB and the bit line contact plug consists of a dielectric. By creating an air gap that partially replaces the dielectric between the CUB and the bit line contact plug, the dielectric constant of the interface between the bit line and the CUB is reduced, thereby reducing the parasitic coupling between the bit line contact plug and the CUB. This enables the creation of CUB capacitors of increased height, making the CUB and the therewith created DRAM devices better suited for the era of sub-micron device dimensions.

21 Claims, 7 Drawing Sheets

METHOD TO REDUCE BIT LINE CAPACITANCE IN CUB DRAMS

BACKGROUND OF THE INVENTION (1) Field of the Invention

The invention relates to the fabrication of integrated circuit devices, and more particularly, to a method to fabricate Capacitors Under the Bit line (CUB) of DRAM devices. The bit line contacts are provided with a surrounding air gap, reducing the parasitic capacitance between the bit line and the capacitor that is created under the bit line.

(2) Description of the Prior Art

Developments in the semiconductor industry have over the years been aimed at creating higher performance devices at competitive or lower prices. These developments have resulted in extreme miniaturization of semiconductor devices, which has been made possible by numerous and mutually supporting advances in semiconductor processes and by advances in the materials that are used for the creation of semiconductor devices, this in combination with new and sophisticated device designs. While most semiconductor devices are aimed at processing digital data, Dynamic Random Access Storage (DRAM) devices incorporate data retention or storage capabilities in the design of the semiconductor device. The creation of capacitive components, which are the basis for the data storage capabilities of DRAM devices, must emphasize that these capacitive components are created on a relatively small surface area of a semiconductor substrate while using methods and procedures that are well known in the art of creating semiconductor devices.

It is well known that capacitors can be created between layers of polysilicon, poly to polycide or metal or between layers of metal. Capacitors can be either of a planar design, for reasons of process simplicity, or can be three-dimensional, resulting in a smaller footprint as commonly used in DRAM devices.

Dynamic Random Access Memory (DRAM) devices typically consist of arrays of memory cells that perform two basic functions, that is the field effect transistor that serves as a charge transfer transistor and a capacitor. The field effect transistor (a source region, a drain region and a gate electrode) serves the function of providing access to the capacitor, the capacitor serves the function of data retention or storage. Binary data is stored as an electrical charge on the capacitor in the individual DRAM memory cells. Contacts to the surrounding circuits are provided for the DRAM memory cell. DRAM memory is so named because DRAM cells can retain information only for a limited period of time before they must be read and refreshed at periodic intervals. In a typical DRAM construction, one side of the transistor is connected to one side of the capacitor. The other side of the transistor and the transistor gate electrode are connected to external connect points that form the bit and word lines. The other side of the capacitor is connected to a reference voltage.

In creating storage capacity in semiconductor memory devices, it is essential that storage node capacitor cell plates are large enough so that an adequate voltage can be retained on the capacitor plates. This even in the presence of parasitic capacitances and circuit noise that may be occur in the circuit during circuit operation. With the continuing increase in circuit density, this latter requirement becomes even more of a challenge in maintaining required storage capabilities. Future generations of dynamic memory storage devices are expected to continue to evolve along the path of further miniaturization and will therefore continue to pose a challenge in creating capacitive storage capabilities at decreasing device dimensions. As the DRAM technology continuous to be scaled down, the height of the storage capacitor needs to be increased further in order to maintain large enough capacitive storage capability for each memory cell. This poses a challenge of reducing parasitic capacitive effects that, with the increase in the height of the storage capacitor, tend to have an increasingly negative effect on the DRAM cell storage capability. The invention addresses this concern and provides a method whereby the effect of parasitic capacitance is reduced for capacitors of increased height by introducing an air-gap as part of the structure.

U.S. Pat. No. 6,168,989B1 (Chiang et al.) shows a crown COB capacitor.

U.S. Pat. No. 6,110,775 (Fujii et al.), U.S. Pat. No. 6,165,839 (Lee et al.), U.S. Pat. No. 6,074,908 (Huang) disclose related capacitor patents.

U.S. Pat. No. 6,140,200 (Eldridge) shows voids and capacitor processes.

SUMMARY OF THE INVENTION

A principle objective of the invention is to create a capacitor-under-bit-line (CUB) whereby parasitic capacitance between the bit line contact and the CUB is significantly reduced.

Another objective of the invention is to create a capacitor-under-bit-line (CUB) that results in a significant reduction of the signal-to-noise ratio during the sensing operation of the DRAM cell.

Yet another objective of the invention is to provide a method of creating CUB DRAM devices that have been provided with an oxide ring surrounding polysilicon plugs.

In accordance with the objectives of the invention a new method is provided for the creation of the bit line contact plug. CUB capacitors typically are located adjacent to the bit line contact plug, a parasitic capacitance therefore exists between the CUB and the contact plug. The interface between the CUB and the bit line contact plug typically consists of a dielectric. By creating an air gap that partially replaces the dielectric between the CUB and the bit line contact plug, the dielectric constant of the interface between the bit line and the CUB is reduced, thereby reducing the parasitic coupling between the bit line contact plug and the CUB. This enables the creation of CUB capacitors of increased height, making the CUB and the therewith created DRAM devices better suited for the era of sub-micron device dimensions.

BRIEF DESCRIPTION OF THE DRAWINGS

FIGS. 3 through 15 address the invention, as follows:

DESCRIPTION OF THE PREFERRED EMBODIMENTS

The main concerns that arise during the fabrication of sub-micron DRAM memory cells and that is addressed by the invention will be highlighted first.

Figure 2:
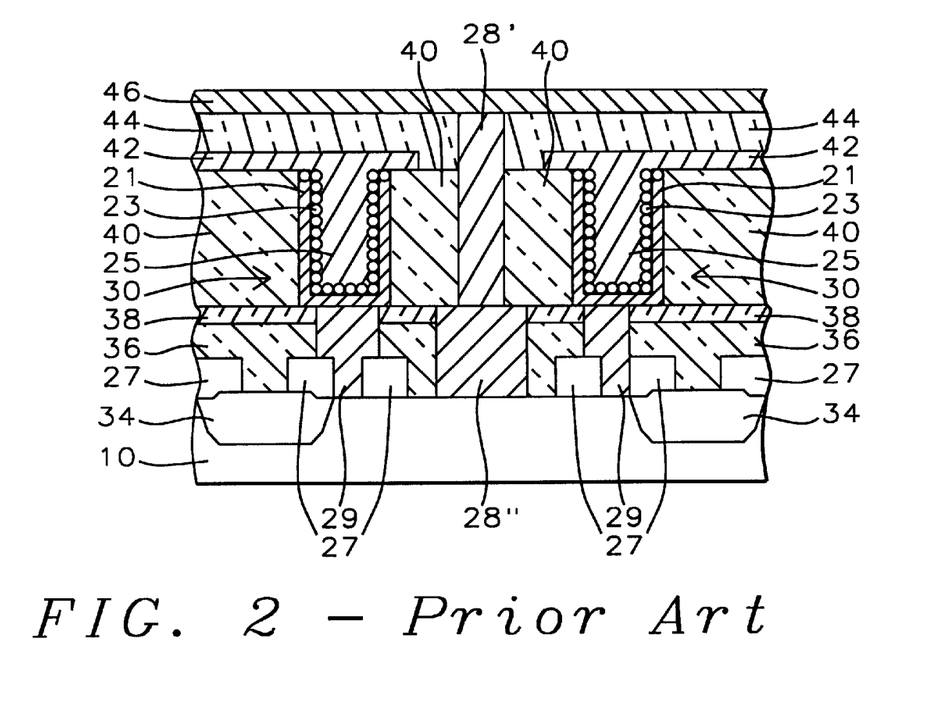
FIG. 2 shows a cross section of a conventional, simplified DRAM cell with CUB capacitors.

During read/sensing operation of a typical DRAM cell, the signal charge that has been stored in the cell capacitor will be transferred to the bit line of the DRAM cell. This results in a small voltage differential or signal DV between a pair of bit lines that are connected to a latch-type sense amplifier. The magnitude of the signal DV is related to $C_s/(C_b+C_s)$, where $C_b$ is the total bit-line capacitance and $C_s$ is the cell capacitance (FIG. 2). Therefore, the $C_b$ should be as small as possible so that the signal is large enough for sensing. However, in the conventional CUB (capacitor under bit line) scheme, the $C_b$ is typically larger than in the corresponding COB (capacitor over bit line) scheme, as contributed by the capacitance from the long bit-line contact to the capacitor sidewalls (FIG. 2).

As DRAM technology continuous to be scaled down, the height of the storage capacitor needs to be increased accordingly in order to maintain large enough capacitance storage capability for each cell. However, the $C_b$, including all other parasitic capacitances between the bit lines and the storage nodes, increases as a result of the scaling down of the DRAM device. To take advantage of the CUB scheme for fabricating DRAM devices, the value of $C_b$ must be decreased to the maximum extent possible. The invention addresses this aspect of DRAM design and provides a method of using air-gaps as part of the DRAM design.

A new fabrication method is provided for the creation of CUB DRAM cells with the creation of an "air gap" surrounding each bit line contact. The air gap assures that the bit line capacitance is significantly reduced due to the low dielectric constant of air, which equals approximately 1. The signal to noise ratio during sensing is therefore significantly improved.

The essential aspects that are addressed in order to create the indicated air gap include:
- the forming of oxide rings around bit line poly plugs, the poly plugs have a width between 0.1 and 0.15 $\mu$m
- immersing the dip oxide rings in HF to form air-gaps after the formation of the polysilicon bit-line plugs has been completed, and
- using PETEOS as ILD above the air gaps, which adequately seals the air-gap due to the poor step coverage or "overhang" that is typical of deposited layers of PETEOS.

The approach of storing charges vertically in a trench results in stacking the storage capacitor on top of the access transistor. The lower electrode of the stacked capacitor (STC) is in contact with the drain of the access transistor whereby the bit line runs over the top of the stacked capacitor. For STC cells to be made feasible for a larger capacity DRAM, an insulator with a larger dielectric constant than that of $SiO_2$ must be used.

It has previously been stated that one of the design objectives in designing dynamic DRAM devices is the design of a capacitor that provides maximum electrical charge storage capability in one individual DRAM cell. An individual Dynamic Random Access Memory (DRAM) cell typically consists of a single metal-oxide-semiconductor field-effect-transistor (MOS-FET) that is provided with a single capacitor for storing electrical data. A unit or bit of data is stored on the capacitor of the DRAM cell as an electrical charge. A number of different approaches have over the years been explored to provide adequate or optimum storage capability. One of these approaches creates stacked capacitors having a three dimensional structure. Such stacking of the capacitors can take the form of double stacking, fin structured stacking, cylindrical designs, spread stacking and boxed structured stacked capacitors.

Figure 1:
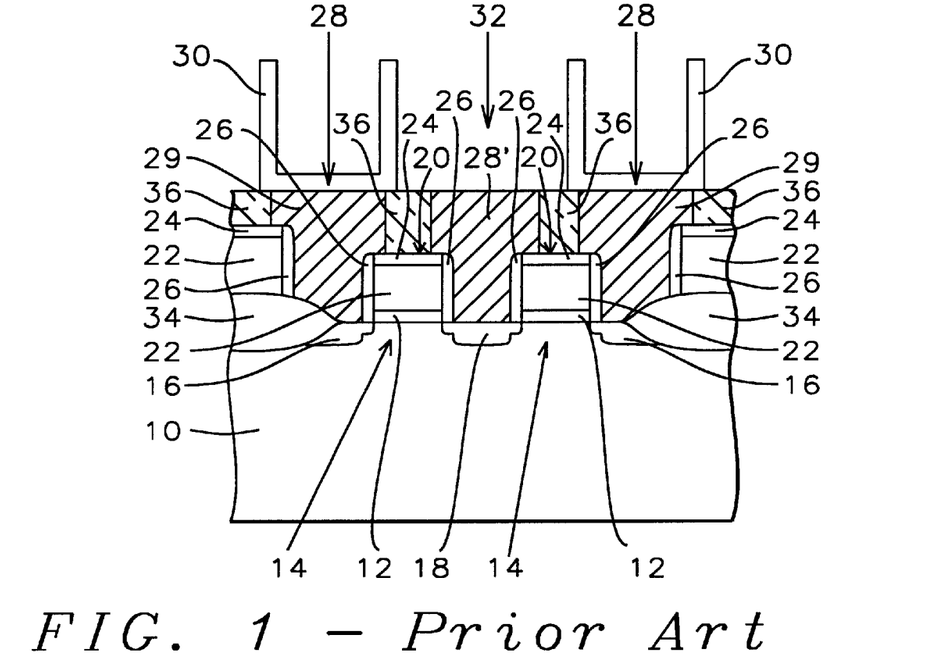
FIG. 1 shows a cross section of a conventional DRAM cell.

A Prior Art method of creating a DRAM memory cell is next highlighted using FIG. 1. Shown in FIG. 1 is a lightly doped p-type single crystal silicon substrate 10 with a crystallographic orientation of <100>. The highlighted DRAM memory region is electrically isolated from its peripheral regions by Field Oxide (FOX) regions 34 that surround the memory region. The FOX region is typically formed by creating Shallow Trench Isolation regions in the surface of the substrate 10. This process starts by etching trenches in the surface of the substrate that are typically between 2000 and 4000 Angstrom deep. The trenches are lined with a layer of thin thermal oxide and filled with an insulating material such as silicon dioxide. The surface of the trenches is then polished (using CMP technology) and made equal in elevation with the surface of the surrounding silicon. A thin layer of gate oxide 12 (between about 40 and 90 Angstrom thick) is next grown over the device area of the surface of the substrate 10 to serve as stress relieve layer. The gate structure of the transistors 14 contains the typical gate structure elements of source (16) and drain (18) regions (formed by implanting an n-type dopant into these regions), the gate electrodes 20 that contain a ($n^+$ doped) polysilicon layer 22 and a silicide layer 24 (to make electrical contact with the top of the gate electrode) and gate spacers 26. The doping of layer 22 can use arsenic or phosphorous as a dopant, typically with a concentration of between 1.0E20 and 1.0E21 atoms/cm and an energy between about 30 and 70 KeV. The polysilicon layer is typically between about 500 and 1500 Angstrom thick and is deposited using Low Pressure Chemical Vapor Deposition (LPCVD) technology. A refractory metal silicide layer (not shown), preferably of tungsten silicide ($WSi_2$) or tungsten hexafluoride ($WF_6$), can be deposited on the layer of poly using LPCVD to a thickness of between about 500 and 2500 Angstrom. A cap oxide layer (not shown) can be deposited on top of the refractory metal silicide; this layer typically contains $SiO_2$ and has a top layer of $SiN_4$ with a thickness of between about 1000 and 2500 Angstrom. The poly layer and the overlying layers are patterned using conventional photolithographic techniques and anisotropic etching to form the poly gate structures over the active area of the silicon substrate while forming word lines over the FOX regions 34.

The insulating sidewall spacers 26 are typically formed by depositing a layer of $Si_3N_4$ using LPCVD and anisotropically etching the layer of $Si_3N_4$. The layer of $Si_3N_4$ is deposited to a thickness of between about 200 and 800 Angstrom.

The source/drain regions 16/18 are formed by ion implant using an n-type dopant such as $p^{31}$ whereby the process of doping is self-aligned with the formed gate structure. The contacts 16/18 are typically doped to a final dopant concentration of between about 1.0E19 and 1.0E21 atoms/$cm^2$.

The contact regions 28 are provided to establish contact between the source regions 16 and capacitors 30, contact region 32 provides access to the drain region 18. Contact 32 forms the bit line contact also referred to as the bit-line self aligned contact. Contact regions 28 form the storage capacitor contacts also referred to as the storage node self aligned contacts 29. Capacitor contact regions 28 and bit line contact region 32 are typically filled with doped polysilicon to form the capacitor contacts 29 and the bit line 28" contact respectively. Field isolation regions 34 isolate the active transistors 14 from the surrounding areas of the silicon substrate. Regions 36 form isolation regions that can for instance contain boro-phosphosilicate-glass (BPSG) or any other suitable isolation material.

Further highlighting the formation of a typical DRAM structure, a relatively thin layer (not shown) of $Si_3N_4$ can be deposited over the created gate electrode structures and the exposed surface of the substrate using LPCVD and a gas mixture such as dichlorosilane ($SiCl_2H_2$) and ammonia ($NH_3$). This layer can be deposited to a thickness of between 50 and 500 Angstrom. After this, a relatively thick insulating layer 36, typically of borophosphodsilicate (BPSG), can be deposited using LPCVD with tetraethosiloxane (TEOS) as a reactant gas. Boron and phosphorous are added during the deposition of the BPSG layer. Layer 36 is then chemically/mechanically polished to provide a planarized surface where layer 36 has a thickness of between 4500 and 9000 Angstrom over the surface of the gate electrodes.

The insulating layer 36 must now be etched to create openings for the contact plugs to form the bit-line and storage node self-aligned contacts. A layer of photoresist is therefore deposited over the surface of layer 36, this layer of photoresist is masked to the pattern of the contact plugs and anisotropically etched to etch the self-aligned openings for contact plugs 29 and 28". For the etch of the photoresist, plasma etching is preferred using Reactive Ion Etching (RIE) with as etchant a gas mixture containing perfluoroisobutylene ($C_4F_8$), trofluoromethane ($CHF_3$), methyflouroride ($CH_3F$), carbon tetrafluoride ($CF_4$), carbon monoxide (CO), oxygen ($O_2$) and argon (Ar). This etch results in forming the pattern 32 for the self-aligned bit-line contact and the pattern 28 for the self-aligned storage node contact.

FIG. 2 shows a somewhat simplified cross section of DRAM cells, a number of the elements that are part of the DRAM cells shown in FIG. 2 have not further been highlighted since these elements have been discussed in detail using FIG. 1. What has been highlighted in FIG. 2 are the parameters that are of importance to the invention, that is the parameters that affect the voltage difference that can be provided by the capacitive charge of the DRAM cells to the sense amplifier. The relationship that expresses the voltage difference that can be derived from the capacitance storage of the DRAM cell that is shown in cross section in FIG. 2 is as follows:

$$\delta V = \{(V_{dd}/2) * C_s\}/(C_b + C_s)$$

where:
  $\delta V$ is the voltage difference that is provided by the capacitive charge of the Capacitor Under Bit line of the DRAM cell that is shown in cross section in FIG. 2
  $C_s$ is the cell capacitance
  $C_b$ is the total parasitic bit line capacitance
Shown as parameters in FIG. 2 are:
  $\epsilon$, the dielectric constant of the dielectric that separates the bit line from the capacitor 30
  h, the height of the CUB 30
  d, the distance between the bit line 28 and the CUB 30.
  Advance semiconductor technology requirements of device miniaturization and the like, which have previously been highlighted, typically result in:
  decreasing the distance d between the bit line 28 and the CUB 30, and
  increasing the height h of the capacitor.
  These changes in the indicated parameters result in, as is also evident from the equation that is shown above:
  an increase in $C_b$, the total parasitic bit line capacitance, from which follows
  a decrease in $\delta V$, the voltage difference that is provided by the capacitive charge of the Capacitor Under Bit line of the DRAM cell.
  This latter decrease in $\delta V$ is to be avoided, the invention provides a method to achieve the avoidance of a decrease in $\delta V$.

Further shown in cross section of FIG. 2 are the following elements which have not previously been shown in FIG. 1:

21, the first or bottom electrodes of CUB capacitors 30

23, the dielectric of CUB capacitors 30

25, the second or top electrodes of CUB capacitors 30

27, gate electrodes that have been formed on the surface of substrate 10; the gate electrodes 27 that are formed on the surface of regions 34 of field isolation oxide are connected to surrounding devices; the gate electrodes 27 that are created on the active surface region of substrate 10 that is bounded by regions 34 are the gate electrodes of the DRAM cell under discussion; it is clear that the gate structures that have been created over the active surface region of the substrate can be created over an underlying layer of insulation, such as the previously highlighted layer of pad oxide (layer 12, FIG. 1)

38, an etch stop layer that has been deposited over the surface of layer 36 of dielectric; this etch stop layer 38 is used for the creation of the openings that are required to create CUB capacitors 30 and the bit line extended contact plug 28'

40, a layer of dielectric that surrounds the bit line 28' and the two CUB capacitors 30

28', an extension of bit line 28"

42, patterned layers of metal that contact the second electrode 25 of CUB capacitors 30; these patterned layers of metal 42 are used to further interconnect CUB capacitors 30

44, a layer of dielectric overlying the patterned layers of metal 42, and 46, the metallic interconnect to bit line 28" which is used for further interconnection of the bit line to surrounding circuitry such as the sense amplifier.

The invention will now be described in detail using FIGS. 3 through 15 for this purpose.

Figure 3:
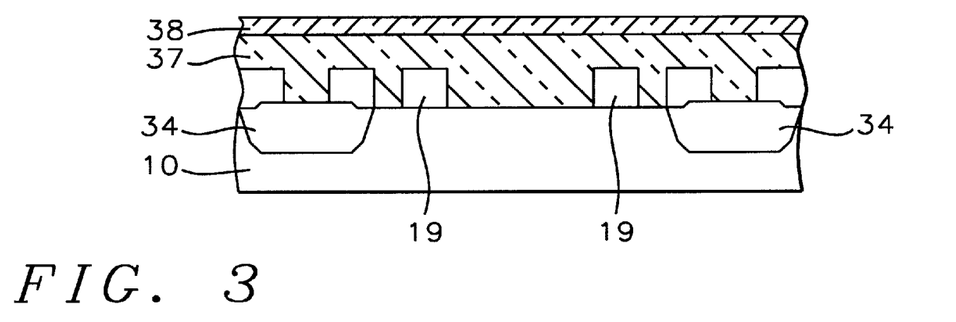
FIG. 3 shows a cross section of a semiconductor substrate on the surface of which gate electrodes have been created, a first layer of dielectric has been deposited over which a layer of etch stop material has been deposited.

FIG. 3 shows a cross section of a semiconductor substrate 10 that has been provided with:

STI regions 34

19, word line of FET devices for the DRAM cell under discussion 37, a layer of dielectric, preferably comprising silicon oxide, deposited over the surface of substrate 10, including the surface of gate electrodes 19 provided on the surface of the substrate 10, and 38, an etch stop layer, preferably comprising silicon nitride, deposited over the surface of layer 37 of dielectric.

As dielectric material for layer 37 can be used any of the typically applied dielectrics such as silicon dioxide (doped or undoped), silicon oxynitride, parylene or polyimide, spin-on-glass, plasma oxide or LPCVD oxide. The material that is used for the deposition of layer 37 of Intra Level Dielectric (ILD) of the invention is not limited to the materials indicated above but can include any of the commonly used dielectrics in the art. The preferred material of the invention for layer 37 is silicon oxide. A typical application of a layer 37 of Intra level Dielectric is depositing a layer of $SiO_2$ using CVD technology at a temperature of between about 400 and 800 degrees C. The layer 37 of ILD is deposited to a thickness that is adequate to cover and to extend above the top surface of the word line FET devices 19. The layer 37 is, after it has been deposited, polished using Chemical Mechanical Polishing (CMP) technology.

The layer 38 of silicon nitride ($Si_3Ni_4$) can be deposited using LPCVD or PECVD procedures at a pressure between about 200 mTorr and 400 mTorr, at a temperature between about 600 and 800 degrees C., to a thickness of about 300 to 500 Angstrom using $NH_3$ and $SiH_4$ or $SiCl_2H_2$. The silicon nitride layer 38 can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 300 and 500 Angstrom.

Figure 4:
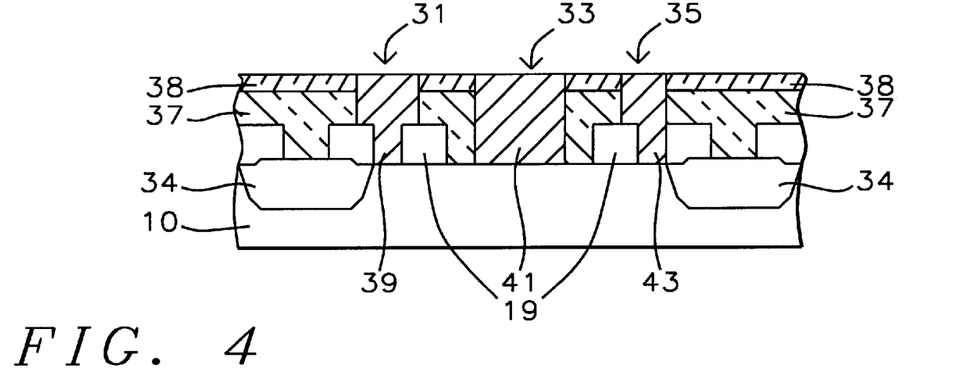
FIG. 4 shows a cross section after openings have been created in the layer of dielectric for a bit line contact plug and for two CUB capacitors. The openings have been filled with polysilicon, providing conductive plugs through the first layer of dielectric.

FIG. 4 shows a cross section of the surface of substrate 10 after:

openings 31, 33 and 35 have been created in the layers 38 of silicon nitride and 37 of silicon oxide a layer (not shown in FIG. 4) of doped polysilicon has been deposited over the surface of the layer 38 of silicon nitride the surface of the deposited layer of polysilicon has been polished, using methods of Chemical Mechanical Polishing (CMP) down to the surface of the layer 38 of silicon nitride.

The sequence of processing steps that are represented by the cross section that is shown in FIG. 4 has resulted in creating conductive plugs 39, 41 and 43 through the layer 37 of silicon oxide. The conductive plugs 39, 41 and 43 align with bit line (plug 41) and capacitor (plugs 39 and 43) contact points; the latter contact points are also referred to as storage node contact holes.

The patterning and etching of layers 38 and 37 uses conventional methods of photolithography and patterning and etching. The stop layer 38 of silicon nitride can be etched using a SiON or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 38 can also be etched using anisotropic RIE using $CHF_3$ or $SF_6$—$O_2$ or $SF_6/HB_8$ as an etchant.

Openings 31, 33 and 35 in layer 37 of silicon oxide can be formed via anisotropic RIE of the silicon oxide layer 37, using $CHF_3$ or $CF_4$—$O_2$—He as an etchant.

The layer of doped polysilicon (not shown in FIG. 4) can be deposited using low-pressure vapor deposition (LPCVD). The thickness of the doped polysilicon layer is between about 3,000 and 4,500 Angstrom such that openings 31, 33 and 35 are filled with polysilicon. The layer of doped polysilicon is preferably deposited by LPCVD using a reactant gas mixture of $SiH_4$ and phosphine ($PH_3$), typically in a temperature range of between 500 and 650 degrees C.

Figure 5:
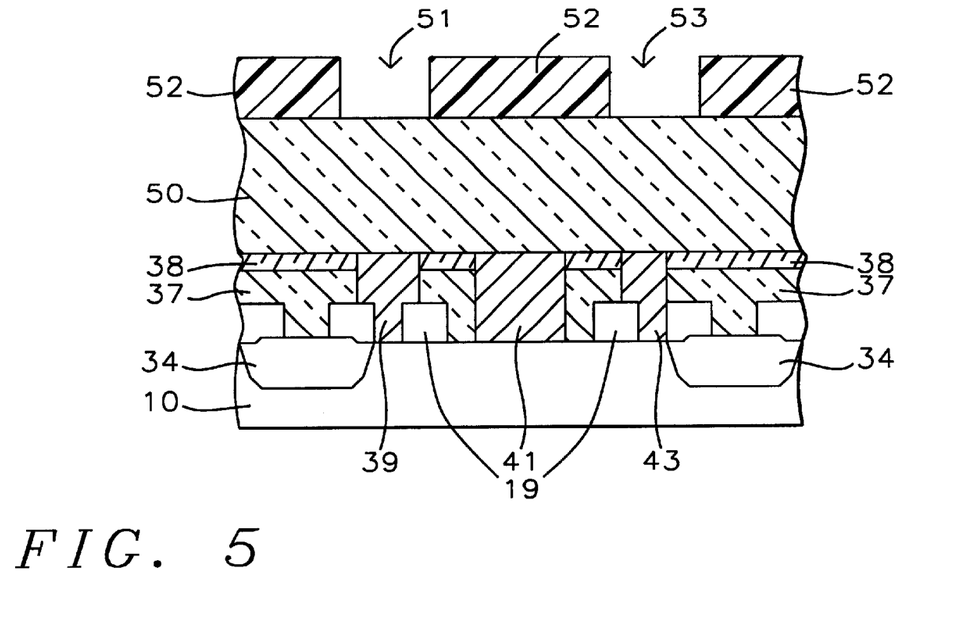
FIG. 5 shows a cross section after a second layer of dielectric has been deposited, a patterned first layer of photoresist has been created on the surface of the second layer of dielectric. The openings that have been created in the layer of photoresist align with the underlying contact plugs for the CUB capacitors that have been created in the first layer of dielectric.

The invention continues with the processing steps of, see FIG. 5:

depositing a second layer of silicon oxide over the surface of layer 38 of silicon nitride and the surface of the doped polysilicon plugs 39, 41 and 43 depositing a first layer 52 of photoresist over the surface of the second layer 50 of silicon oxide patterning and developing the first layer 52 of photoresist, creating openings 51 and 53 in the layer 52 of photoresist that align with the node contacts 39 and 43.

The processing steps that are represented by the cross section that is shown in FIG. 5 have either previously been highlighted and/or follow conventional methods of oxide deposition and photoresist processing. These steps will therefore not be further discussed at this time.

Figure 6:
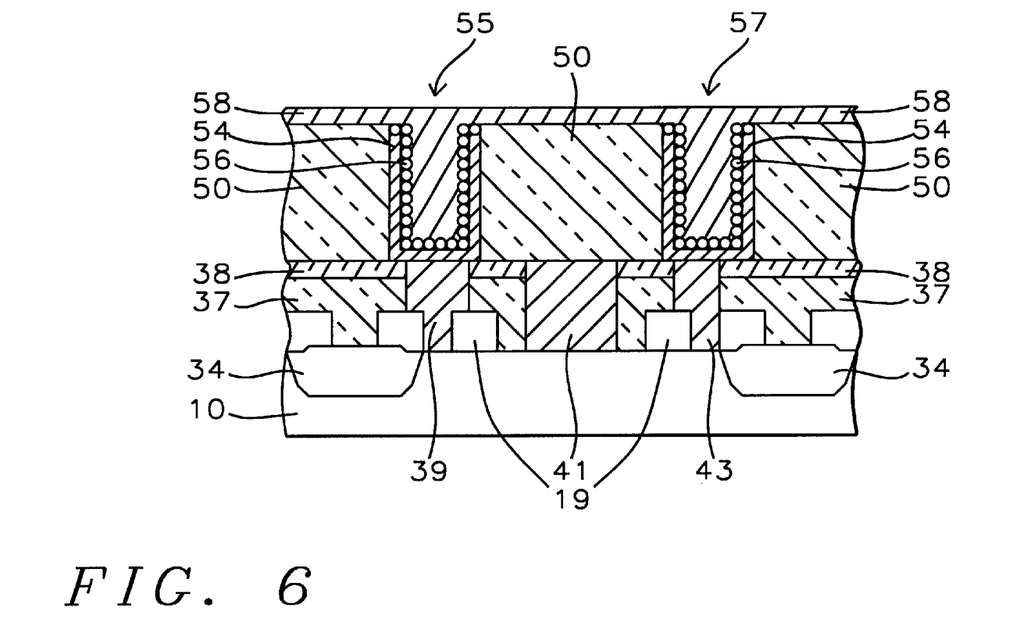
FIG. 6 shows a cross section after the second layer of dielectric has been etched in accordance with the openings that have been created in the first layer of photoresist. The first electrode, dielectric and second electrode of the CUB capacitors have been deposited inside the openings created in the second layer of dielectric. The patterned layer of photoresist has been removed.

Referring to the cross section that is shown in FIG. 6, the following processing steps are highlighted:

the layer 50 of silicon oxide has been etched in accordance with the openings 51 and 53 that have been created in the layer 52 (FIG. 5) of photoresist the layer 52 of photoresist is removed from the surface of the etched layer 50 of silicon oxide a layer 54 of HSG has been grown on the surface of oxide layer 50, including inside surfaces of openings 55 and 57 that have been created in the layer 50 of silicon oxide; this layer 54 of HSG forms the first or bottom electrode of the CUB capacitor the layer 54 of HSG overlying the layer 50 is polished, using methods of CMP, removing the HSG from the surface of layer 50 and leaving the grown layer 54 in place overlying the inside surfaces of openings 55 and 57; the lower electrode of the CUB capacitor is now complete a layer 56 of ONO or NO dielectric is deposited over the surface of the oxide layer 50 and the HSG layer 54 to form the dielectric of the capacitor, and a layer 58 of polysilicon is deposited, this layer 58 is used to form the second electrode of the capacitor.

Relating to the layer 54 of HSG the following comments apply. Thin films of amorphous and polycrystalline silicon are widely used in semiconductor manufacturing. For example, amorphous silicon can be used for the formation at the gate of CMOS structures for application in the dual gate process since the amorphous silicon can effectively reduce the Boron (B) penetration from the gate to the device region. Doped polycrystalline silicon can be used to form interconnects, gate electrodes, emitter structures and resistors. These silicon thin films are typically formed by LPCVD (low pressure chemical vapor deposition) by decomposition of a silicon gas such as silane ($SiH_4$) or disilane ($Si_2H_6$). Doping can also be accomplished in the gas phase by introducing a dopant gas such as diborane ($B_2H_6$), arsine ($AsH_3$) or phosphine ($PH_3$). The deposition temperature during LPCVD is typically from 500 degrees C. to 675 degrees C. and the pressure is typically from 200 mTorr to 2 Torr. The crystalline structure of the 'as deposited' film is largely a function of the deposition temperature. At temperatures below about 550 degrees C. the 'as deposited' films have an amorphous structure. At temperatures between about 550 degrees C. and 580 degrees C., there is a transition between amorphous silicon and polycrystalline silicon. Hemispherical grain (HSG) polysilicon is typically grown in this transitional range. At temperatures above about 580 degrees C. the 'as deposited' films have a polycrystalline structure.

For the deposition of layer 56 of ONO, that is a layer of oxide-nitride-oxide, the first layer of oxide is native oxide or thermally grown oxide or CVD deposited oxide. The nitride is deposited by LPCVD at a temperature within the range of 600 to 700 degrees C. to a thickness within the range of between 40 and 60 Angstrom, the final oxidation layer is grown in a furnace at a temperature within the range between 700 and 800 degrees C. for a time period within the range between 30 and 120 minutes.

Layer 58, FIG. 6, forms the top capacitor plate and is to be doped in order to establish the desired level of conductivity. For purposes of post-CMP processing or for RIE processing, layer 58 should be thick enough, such as between for instance about 1,000 and 2,000 Angstrom. Layer 56, FIG. 6, is a thin layer of dielectric, such as ONO/ON, which isolates the two layers 54 and 58 from each other.

Figure 7:
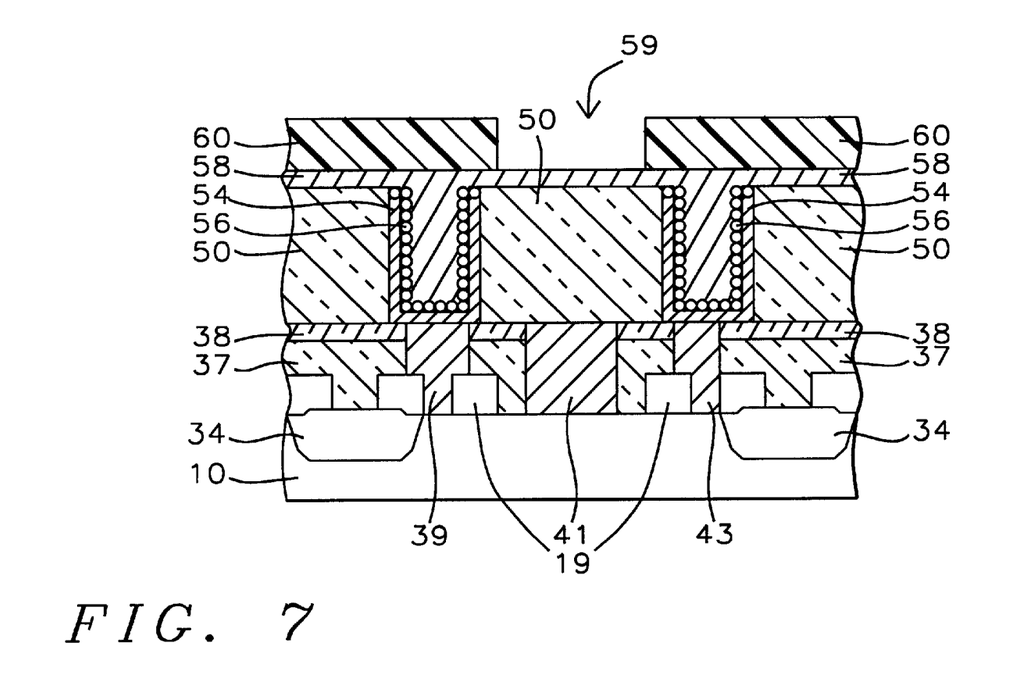
FIG. 7 shows a cross section after a second patterned layer of photoresist has been created on the surface of the layer that serves as the second electrode of the CUB capacitors. The opening created in the patterned second layer of photoresist aligns with the contact plug of the bit line that has been created in the first layer of dielectric.

FIG. 7 shows in cross section the following processing steps of the invention:

a second layer 60 of photoresist is deposited over the surface of the layer 58 of polysilicon the second layer 60 of photoresist is patterned and developed using conventional methods of photolithography and resist development, creating an opening 59 in the second layer 60 of photoresist that aligns with the bit line contact plug 41.

The processing steps that are represented by FIG. 7 use conventional processing and therefore do not need to be further discussed at this time.

Figure 8:
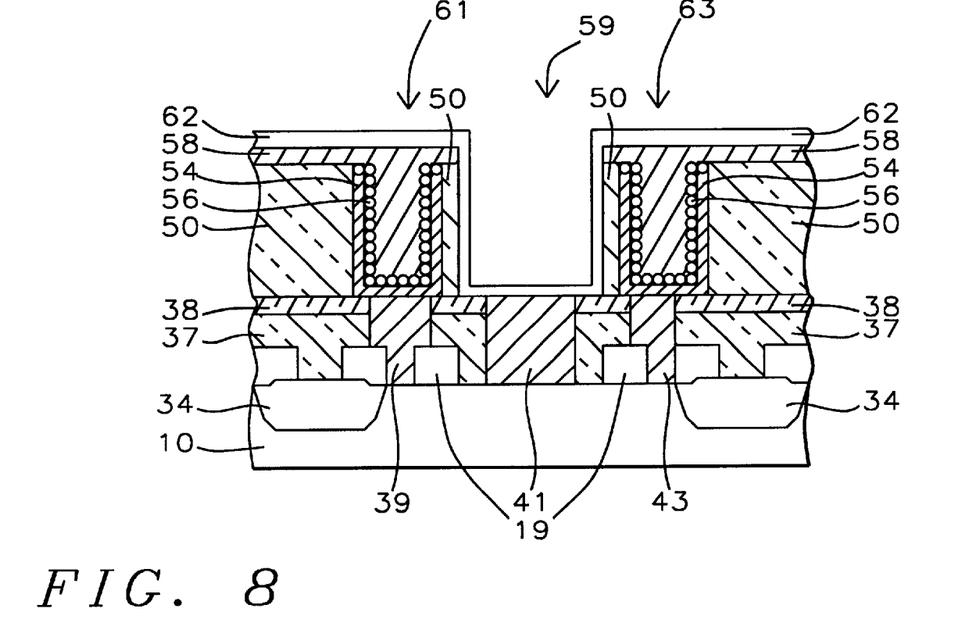
FIG. 8 shows a cross section after an opening has been created in the second layer of dielectric in accordance with the opening that has been created in the second layer of photoresist. The patterned second layer of photoresist has been removed, a layer of F-poly has been deposited over the surface of the second electrode of the CUB capacitors and the inside surfaces of the opening created in the second layer of dielectric.

The cross section that is shown in FIG. 8 represents the following processing steps:

layer 58 of polysilicon has been etched in accordance with the openings 59 that has been created in the overlying second layer 58 of photoresist (FIG. 7), opening the second or top electrodes 58 for CUB capacitors the etch of layer 58 is continued through layer 50 of silicon oxide; the etch of layer 50 continues down to the surface of the bit line contact plug 41, exposing the surface of plug 41, using the layer 38 of silicon nitride as the etch stop layer; note in FIG. 8 that layers of silicon oxide dielectric 50 remain in place overlying facing, outside surfaces of the CUB capacitors 61 and 63 the patterned and developed layer 60 of photoresist is removed from the surface of the etched second electrodes 59 of the CUB capacitors, and a layer 62 of non-doped polysilicon, also referred to as flat-poly or F-poly, is deposited over the exposed surfaces, that is the surface of the etched second electrodes 58 of the CUB capacitors 61 and 63 and the inside surfaces of the opening 59 that has been created through the layer 50 of silicon oxide.

Layer 62 of F-poly can be deposited using low-pressure vapor deposition (LPCVD) using, for example, silane ($SiH_4$), to a thickness of between about 200 and 500 Angstrom. The layer of polysilicon is preferably deposited by LPCVD using a reactant gas such as $SiH_4$ or $SiH_2Cl_2$, typically in a temperature range of between 600 and 650 degrees C.

Figure 9:
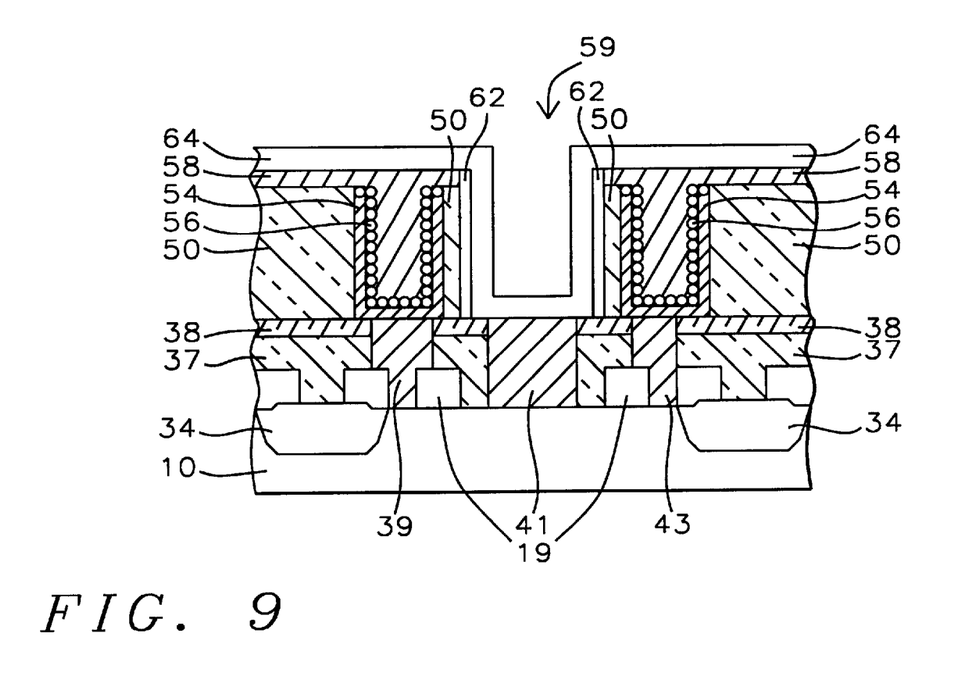
FIG. 9 shows a cross section after the F-poly has been removed from the surface of the second electrode of the CUB capacitors, a layer of LPTEOS has been deposited.

Proceeding with the invention, FIG. 9 shows the processing steps of:

removing the deposited layer 62 of flat-poly from the surface of the second electrode 58 of the CUB capacitors 61 and 63; this etch can be performed using carbon tetrofluoride ($CF_4$)/$CHF_3$ as etchant gas, using a commercially available parallel plate RIE etcher or an Electron Cyclotron Resonance (ECR) plasma reactor; this etch results in leaving in place layers of flat-poly over the inside sidewalls of opening 59 forming sidewall spacers inside the opening 59 a layer 64 of low-pressure tetra-ethyl-ortho-silicate (LPTEOS) has been deposited over the sidewall spacers 62 inside opening 59 and over the surface of the exposed surface of the second electrode of the CUB capacitors 61 and 63, using methods of CVD, to a thickness between about 500 and 1500 Angstrom.

Figure 10:
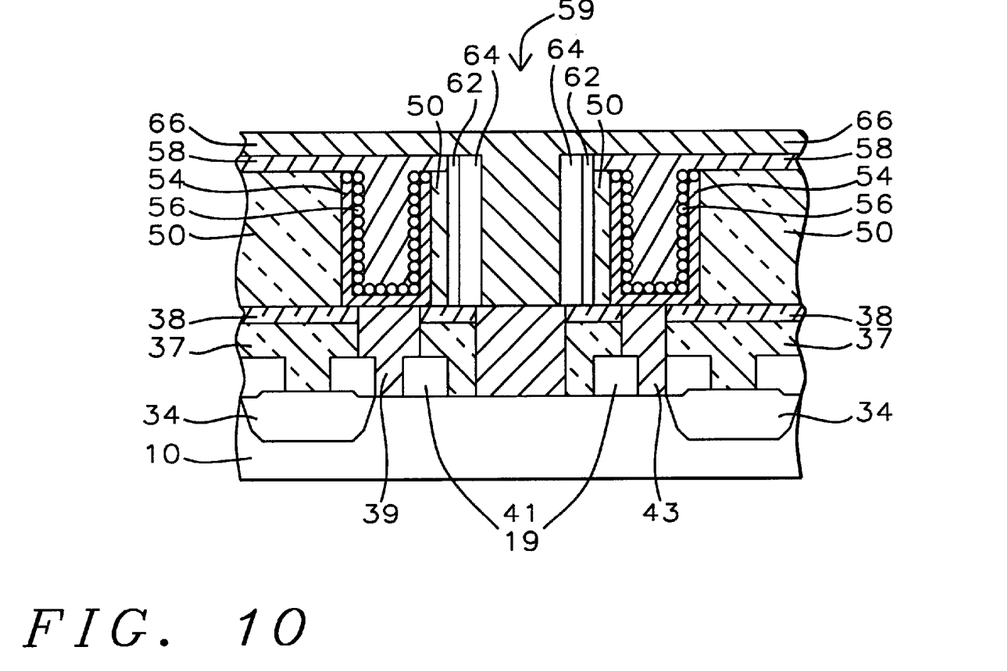
FIG. 10 shows a cross section after the LPTEOS has been removed from the surface of the second electrode of the CUB capacitors, a layer of D-poly has been deposited.

FIG. 10 shows a cross section wherein:

the layer 64 of LPTEOS has been removed from the surface of the second electrode 58 of the CUB capacitors 61 and 63 using methods of Reactive Ion Etch (RIE) and applying carbon tetrofluoride ($CF_4$)/$CHF_3$ as etchant gas; the layer 64 of LPTEOS remains in this manner in place overlying layer 62 and becomes part of the spacers that are formed over the sidewalls of opening 59; it is clear from the cross section that is shown in FIG. 10 that the spacers overlying the sidewalls of opening 59 comprise three layers, that is layer 50 of silicon oxide, layer 62 of F-poly and layer 64 of LPTEOS; further shown in cross section in FIG. 10 is layer 66 of D-polysilicon, which is deposited to a thickness between about 1500 and 3000 Angstrom and is deposited such that the opening 59 is completely filled with layer 66 of D-polysilicon.

Layer 66, FIG. 10, has been highlighted as comprising D-polysilicon, layer 66 is not limited to D-polysilicon but can also comprise a metal film since this layer is an interconnect layer. In view of this, the dopant concentration (of for instance $PH_3$) should be as high as possible.

Figure 11:
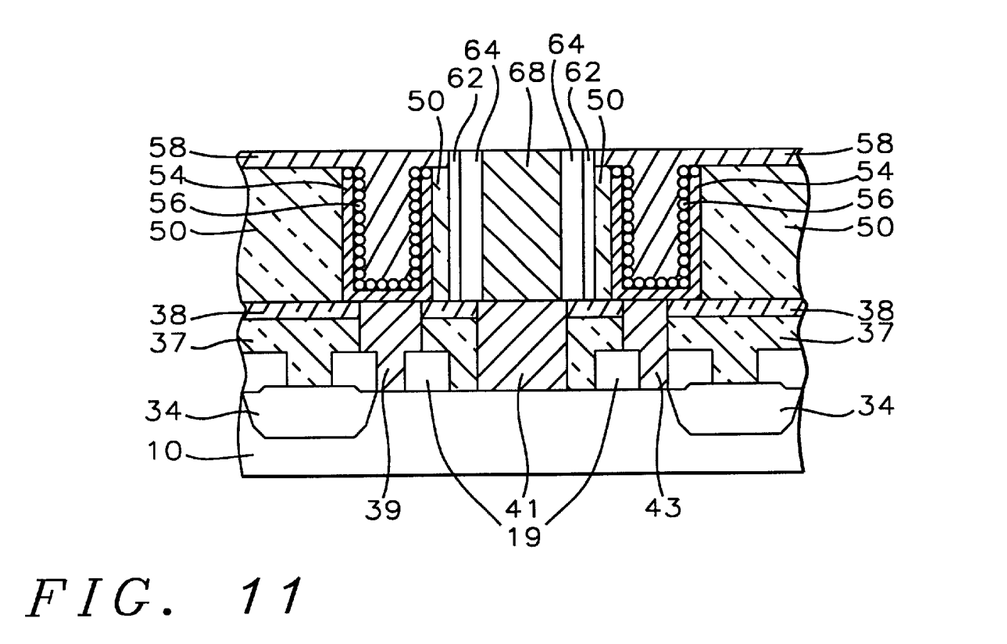
FIG. 11 shows a cross section after the D-poly has been removed from the surface of the second electrode of the CUB capacitors, exposing the surface of the concentric rings of material that have been deposited inside the opening that has been created in the second layer of dielectric that aligns with the bit line contact plug created in the first layer of dielectric.

FIG. 11 shows a cross section after the surface of deposited layer 66 has been polished using methods of CMP or an RIE etchback. It is clear from the cross section that is shown in FIG. 11 that an "isolated plug" 68 comprising D-polysilicon has been formed aligned with the bit line contact plug 41. Layers 50 of silicon oxide, layer 62 of F-poly and layer 64 of LPTEOS surround the isolated plug 58. Key to the invention is the presence of ring 64 of LPTEOS which, being a ring comprising tetra-ethylorthosilicate (TEOS) based oxide, can be removed from around the isolated plug 68.

Figure 12:
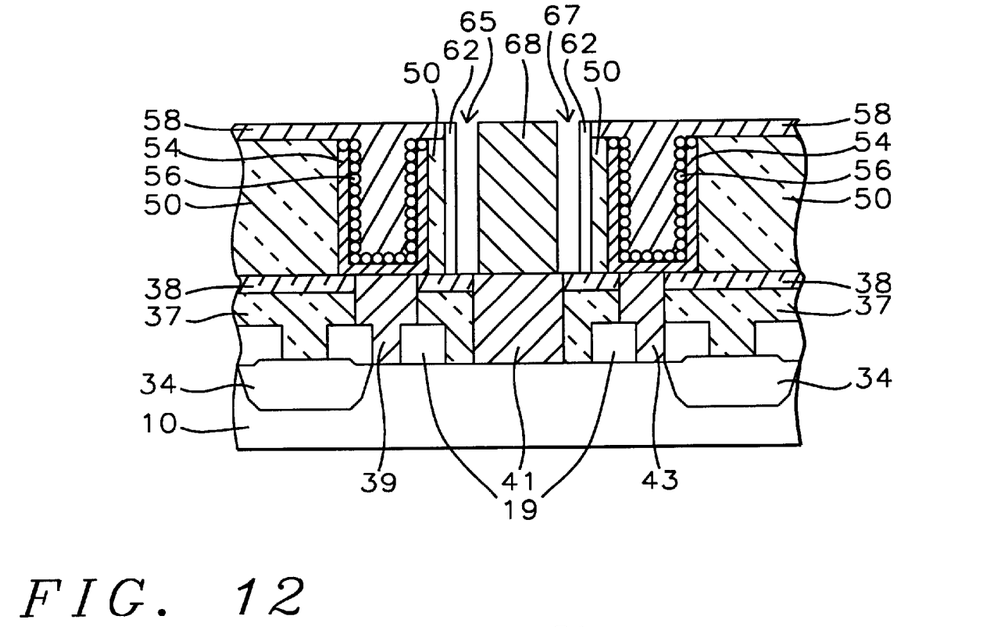
FIG. 12 shows a cross section after the layer of LPTEOS has been removed from the opening that has been created in the second layer of dielectric that aligns with the bit line contact plug created in the first layer of dielectric.

FIG. 12 shows a cross section after layer 64 of LPTEOS has been removed from around the isolated plug 78. This removal is achieved by wet buffer oxide etching using diluted HF (HF solution). This wet buffer oxide etch or HF dip is a one time process performed at atmospheric pressure using a conventional wet bench process with a ratio of $H_2O:HF$ of between about 20:1 and 100:1. Openings 65 and 67 are in this manner created, the removal of layer 64 removes an oxide ring of about 0.05 to 0.15 $\mu$m width from around plug 68.

Further remains to seal to openings 65 and 67 that have been created surrounding the isolated plug 68. This is accomplished, FIG. 13, by depositing a layer 78 of PETEOS over the surface of the second electrode 58 of the capacitors 61 and 63. PETEOS when deposited is known to have poor step coverage or "overhang" which in this case results in the openings 65 and 67 being closed off be the "overhanging" PETEOS.

Figure 13:
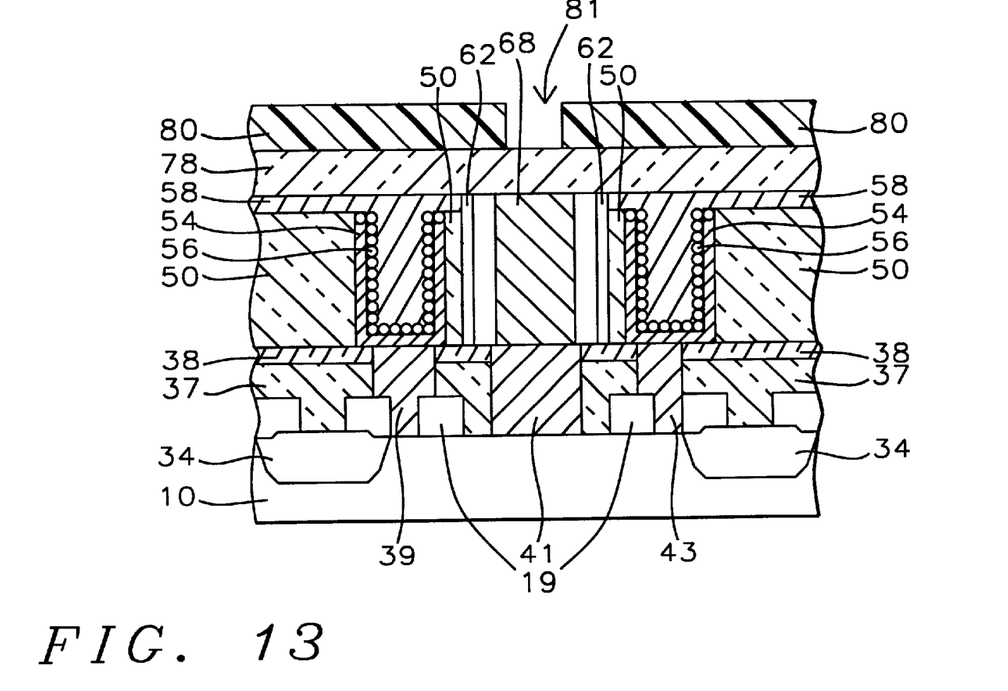
FIG. 13 shows a cross section after a layer of PETEOS has been deposited over the surface of the second electrode of the CUB capacitors, including the surface of the opening that has been created in the second layer of dielectric that aligns with the bit line contact plug in the first layer of dielectric.

Further shown in cross section in FIG. 13 is the deposition and developing of a layer 80 of photoresist. The developing of the layer 80 of photoresist has created an opening 81 in layer 80 of photoresist that aligns with the bit line contact plug 41.

Figure 14:
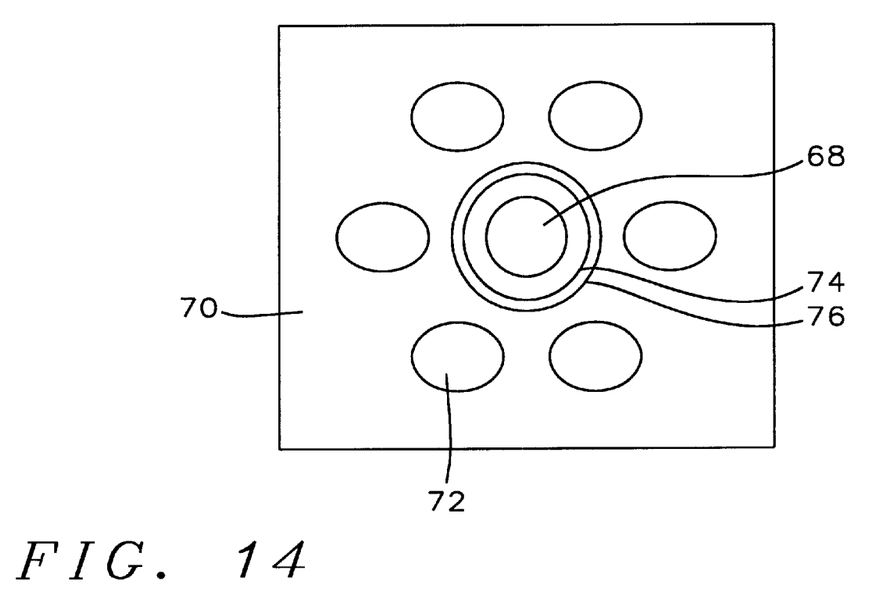
FIG. 14 shows a top view of the CUB of the invention, including the bit line contact and the layers of material that surround the bit line contact plug.

A top view of the bit line plug which has been created before the deposition of the layer 66 of PETEOS is shown in FIG. 14, which shows:

68, the surface of the bit line contact
70, the top plate of poly layer 58
72, the cell capacitor
74, the air gap 65/67, and
76, the F-poly 62.

Figure 15:
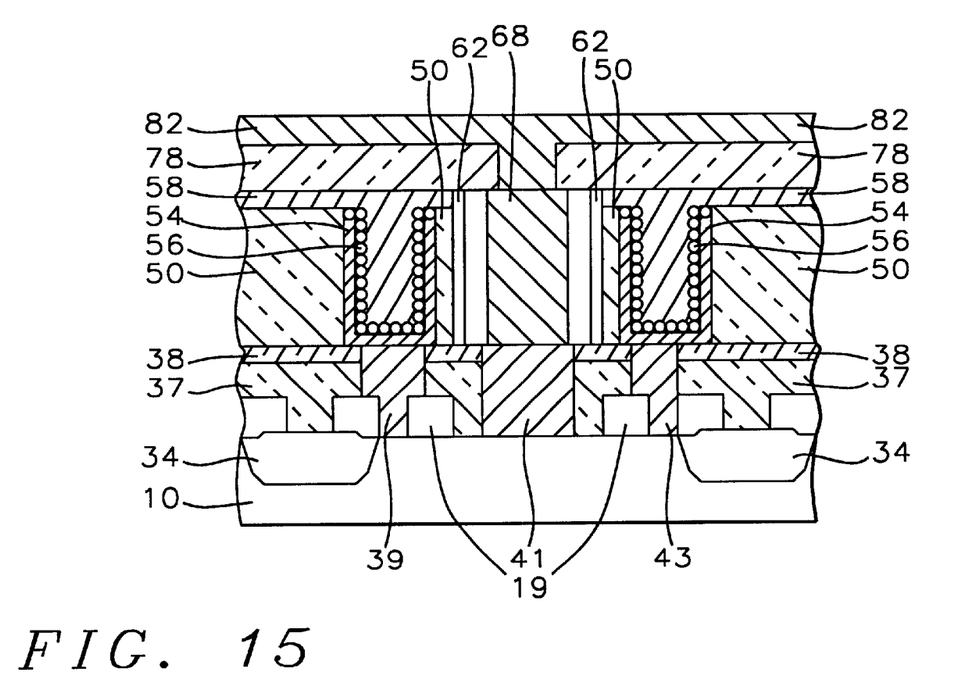
FIG. 15 shows a cross section of the completed DRAM cell of the invention, including the CUB capacitors and the bit line contact.

FIG. 15 shows in cross section after layer 78 of dielectric has been etched in accordance with opening 81 that has been created in layer 80 (FIG. 13) of photoresist, the layer 80 (FIG. 13) of patterned photoresist has been removed from the surface, a layer 82 of metal has been deposited, filling opening 81 and contacting the surface of bit plug 68 (FIG. 11). The patterning of layer 82 (not shown) creates the bit lines of the DRAM cells of the invention.

The invention can be summarized as follows:

a silicon semiconductor substrate is provided, STI regions have been created in the surface of the substrate that define and bound the active surface region of the substrate; gate electrodes have been provided over the active region of the substrate; of special interest are storage node contact and bit line contact that have been provided on the active surface region of the substrate a first layer of dielectric is deposited over the surface of the substrate, including the surface of the gate electrodes that have been created in the active surface region of the substrate; a layer of etch stop material is deposited over the surface of the first layer of dielectric openings are created in the first layer of dielectric that align-with the bit line (one opening) and capacitor (charge node, two openings) contacts on the surface of the substrate; the openings are filled with doped polysilicon, the deposited polysilicon is polished creating conductive plugs through the first layer of dielectric for the charge node and bit line contacts of the DRAM cell a second layer of dielectric is deposited over the surface of the etch stop layer; a patterned first layer of photoresist is created over the surface of the second layer of dielectric; the pattern of openings that have been created in the second layer of dielectric aligns with the node contacts of the DRAM cell; CUB capacitors are to be created in these openings the second layer of dielectric is etched in accordance with the openings that have been created in the first layer of photoresist, exposing the surface of the charge node contact plugs created in the first layer of dielectric; the patterned first layer of photoresist is removed, exposing the surface of the second layer of dielectric; first electrode material (HSG) is deposited and polished creating the first electrodes of the CUB capacitors; dielectric layers (ONO) are deposited over the first electrodes of the CUB capacitors a layer of D-poly is deposited over the exposed surface of the second layer of dielectric and the dielectric layers of ONO the layer of D-poly is etched, creating the second electrodes of the CUB capacitors; the etch is continued through the second layer of dielectric and stopped on the surface of the etch stop layer, exposing the surface of the bit line contact plug created in the first layer of dielectric, leaving in place a layer of second dielectric between the first electrodes of the CUB capacitors and the sidewalls of the opening that is created in the second layer of dielectric a layer of F-poly is formed over the layer of first dielectric that has been left in place over the sidewalls of the opening created in the second layer of dielectric a layer of LPTEOS is formed over the layer of F-poly over the sidewalls of the opening created in the second layer of dielectric the opening created in the second layer of dielectric is fully filled with D-poly, forming a conductive plug through the second layer of dielectric the layer of LPTEOS is removed from the opening created in the second layer of dielectric a layer of PETEOS is deposited over the exposed surface of the second electrode of the CUB capacitors, closing the opening created in the second layer of dielectric the layer of PETEOS is patterned and etched, creating an opening in the layer of PETEOS that aligns with the conductive plug formed through the second layer of dielectric, and the opening that has been created in the layer of PETEOS is filled with metal, the layer of deposited metal overlying the layer of PETEOS is polished and patterned to create interconnect metal to the bit line of the DRAM cell.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of fabricating a bit line for a DRAM device on a semiconductor substrate, wherein a top portion of a bit line contact hole is provided with an air gap, comprising the steps of:

providing a semiconductor substrate, an active surface region having been defined and being bounded by Shallow Trench Isolation regions in the surface of said substrate, two gate structures having been provided on the active surface region of the substrate overlying a gate insulation layer, with two source regions and a drain region having been provided in the surface of said substrate self-aligned with and at the sides of and between the two gate structures, said drain region forming a bit line contact in the surface of said substrate, said two source regions forming storage node contacts in the surface of said substrate;

depositing a first layer of dielectric over the surface of the substrate, including the surface of said two gate structures provided over the active surface region of the substrate;

depositing a layer of etch stop material over the surface of said first layer of dielectric;

creating capacitors overlying said storage node contact points provided in the surface of said substrate, said creating capacitors comprising creating a first conductive plug overlying and being in contact with said bit line contact provided in the surface of said substrate;

creating a second conductive plug overlying said first conductive plug, said second conductive plug being surrounded by said air gap, said air gap being formed between the second conductive plug and material surrounding the second conductive plug;

closing said air gap surrounding said second conductive plug, said closing said air gap comprising:
 (i) deposition of a layer of oxide; and
 (ii) polishing the surface of said deposited layer of oxide; and providing interconnect metal to said second conductive plug.

2. The method of claim 1 wherein said creating capacitors overlying said storage node contact points provided in the surface of said substrate comprises steps of:

patterning and etching said etch stop layer and said first layer of dielectric, creating openings through said etch stop layer and said first layer of dielectric that align with said bit line contact and said storage node contacts provided in the surface of said substrate, exposing the surface of said storage node contact points and said bit line contact point provided in the surface of said substrate;

depositing a layer of polysilicon over the surface of said etch stop layer, filling said openings created through said etch stop layer and said first layer of dielectric;

polishing the surface of said layer of polysilicon down to the surface of said etch stop layer, creating conductive plugs through said etch stop layer and said first layer of dielectric, said conductive plugs comprising a first conductive plug overlying and being in contact with said bit line contact, said conductive plugs further comprising conductive plugs overlying and being in contact with said storage node contacts provided in the surface of said substrate;

depositing a second layer of dielectric over the surface of said etch stop layer, including the surface of said conductive plugs created through said etch stop layer and said first layer of dielectric;

patterning and etching said second layer of dielectric, creating openings through said second layer of dielectric that align with said storage node contacts provided in the surface of said substrate;

depositing a first layer of conductive material over the surface of said second layer of dielectric, including inside surfaces of said openings created in said second layer of dielectric;

polishing the surface of said first layer of conductive material down to the surface of said second layer of dielectric, exposing the surface of said second layer of dielectric, completing creation of first electrodes of said capacitors;

depositing a layer of capacitance dielectric over the surface of said second layer of dielectric, including the surfaces of said first electrodes of said capacitors created in said second layer of dielectric;

depositing a second layer of conductive material over the surface of said capacitance dielectric; and patterning and etching said second layer of conductive material, creating an opening through said second layer of conductive material that aligns with said bit line contact provided in the surface of said substrate, completing the creation of second electrodes of said capacitors, said etching to continue through said second layer of dielectric, exposing the surface of said first conductive plug created in said first layer of dielectric, leaving in place a layer of said first layer of dielectric over sidewalls of said opening created in said second layer of dielectric, said opening created through said second layer of conductive material and said second layer of dielectric having inside surfaces comprising sidewalls and a bottom surface.

3. The method of claim 2 wherein said depositing a first layer of conductive material comprises depositing a layer of HSG.

4. The method of claim 2 wherein said depositing a layer of capacitance dielectric comprises depositing a layer of ONO.

5. The method of claim 2 wherein said depositing a second layer of conductive material comprises depositing a layer of polysilicon.

6. The method of claim 2 wherein said creating a second conductive plug overlying said first conductive plug, said second conductive plug being surrounding by layers of material in addition to an air gap, comprises the steps of:

depositing a layer of F-polysilicon over the surface of said second electrode of said capacitors, including inside surfaces of said opening created through said second layer of dielectric;

removing said F-polysilicon from the surface of said second electrode of said capacitors and from the bottom surface of said opening created through said second layer of dielectric, leaving in place a layer of F-polysilicon deposited over said first layer of dielectric over sidewalls of said opening created through said second layer of dielectric;

depositing a layer of LPTEOS over the surface of said layer second electrode of said capacitors, including the surface of said layer of F-polysilicon left in place in said opening created through said second layer of dielectric;

removing said LPTEOS from the surface of said second electrode of said capacitors and from the bottom surface of said opening created through said second layer of dielectric, leaving in place a layer of LPTEOS deposited over said layer of F-polysilicon left in place in said opening created through said second layer of dielectric;

depositing a layer of D-polysilicon over the surface of said second electrode of said capacitors, fully filling said opening created through said second layer of dielectric;

removing said D-polysilicon from the surface of said second electrode of said capacitors, leaving in place a column of D-polysilicon surrounded by said layer of LPTEOS left in place in said opening created in said second layer of dielectric; and removing said layer of LPTEOS from said opening created in said second layer of dielectric, creating said air gap surrounding said second plug overlying said first conductive plug.

7. The method of claim 6 wherein said removing said F-polysilicon from the surface of said second electrode of said capacitors comprises applying a Reactive Ion Etch (RIE) process.

8. The method of claim 6 wherein said removing said LPTEOS from the surface of said second electrode of said capacitors comprises applying a Reactive Ion Etch (RIE) process.

9. The method of claim 6 wherein said removing said D-polysilicon from the surface of said second electrode of said capacitors comprises applying methods of Chemical Mechanical Polishing.

10. The method of claim 6 wherein said removing said layer of LPTEOS from said opening created in said second layer of dielectric comprises applying wet buffer oxide etching using diluted HF.

11. The method of claim 2 wherein said closing said air gap surrounding said second conductive plug comprises depositing a layer of PETEOS over the surface of said second electrode of said capacitors, including the surface of said opening created in said second layer of dielectric.

12. The method of claim 11 wherein said providing interconnect metal to said second conductive plug comprises the steps of:

patterning and etching said layer of PETEOS, creating an opening in said layer of PETEOS that aligns with said bit line contact provided in the surface of said substrate;

depositing a layer of metal over the surface of said layer of PETEOS, filling said opening created in said layer of PETEOS, leaving a layer of metal of a measurable thickness overlying the surface of said layer of PETEOS;

polishing the surface of said layer of metal deposited over the surface of said layer of PETEOS; and patterning and etching said layer of metal deposited over the surface of said layer of PETEOS, creating inter connect metal for said bit line for a DRAM device.

13. The method of claim 1, said capacitors overlying said storage node contact points provided in the surface of said substrate comprising a first electrode, further comprising a layer of capacitor dielectric, further comprising a second electrode having a surface, said creating capacitors further comprising creating a first conductive plug overlying and being in contact with said bit line contact provided in the surface of said substrate, said capacitors being created in a second layer of dielectric deposited over the surface of said etch stop layer, said creating said capacitors further comprising creating an opening through a second layer of dielectric deposited over the surface of said etch stop layer that aligns with said first conductive plug created in the first layer of dielectric.

14. A method of fabricating a bit line for a DRAM device on a semiconductor substrate, Capacitor Under Bit Line (CUB) capacitors being part of said DRAM device, wherein a top portion of a bit line contact hole for said DRAM device is provided with an air gap, comprising the steps of:

providing a semiconductor substrate, an active surface region having been defined and being bounded by Shallow Trench Isolation regions in the surface of said substrate, two gate structures having been provided on the active surface region of the substrate overlying a gate insulation layer, with two source regions and a drain region having been provided in the surface of said substrate self-aligned with and at the sides of and between the two gate structures, said drain region being located between said two gate structures, said two source regions between located between said two gate structures and said regions of STI, said drain region forming a bit line contact in the surface of said substrate, said two source regions forming storage node contacts in the surface of said substrate;

depositing a first layer of dielectric over the surface of the substrate, including the surface of said two gate structures provided over the active surface region of the substrate;

depositing a layer of etch stop material over the surface of said first layer of dielectric;

patterning and etching said etch stop layer and said first layer of dielectric, creating an opening in the etch stop layer and the first layer of dielectric that aligns with the bit line contact provided on the surface of the substrate, further creating two openings in the etch stop layer and the first layer of dielectric that align with the storage node contact provided in the surface of the substrate;

depositing a layer of polysilicon over the surface of the etch stop layer, filling the openings created in the etch stop layer and the first layer of dielectric with polysilicon;

polishing the deposited layer of polysilicon down to the surface of the etch stop layer, creating conductive plugs through the etch stop layer and first layer of dielectric for storage node contacts and bit line contact;

depositing a second layer of dielectric over the surface of the etch stop layer, including the surface of the conductive plugs that have been created through the etch stop layer and the first layer of dielectric;

creating a patterned first layer of photoresist over the surface of the second layer of dielectric, the pattern of openings created in the first layer of photoresist second layer of dielectric aligning with the storage node contacts provided in the surface of the substrate;

etching the second layer of dielectric in accordance with the openings that have been created in the first layer of photoresist, exposing the surface of the storage node contacts created in the first layer of dielectric;

removing the patterned first layer of photoresist from the surface of the second layer of dielectric, exposing the surface of the second layer of dielectric;

depositing a first electrode material over the surface of the second layer of dielectric, including inside surfaces of the openings created in the second layer of dielectric;

polishing the surface of the deposited first electrode material down to the surface of the second layer of dielectric, completing the creation first electrodes of the CUB capacitors;

depositing a layer of capacitor dielectric over the surface of the second layer of dielectric, including the surface of the created first electrodes of the CUB capacitors;

depositing a second electrode material over the exposed surface of the second layer of dielectric, including the surface of said capacitor dielectric;

patterning and etching the layer of second electrode material, creating an opening through said layer of second electrode material that align with said bit line contact, creating second electrodes of the CUB capacitors;

etching through the second layer of dielectric in a pattern of said opening created through said second electrode material, stopping on the surface of the etch stop layer, creating an opening in the second layer of dielectric, exposing the surface of the bit line contact plug created in the first layer of dielectric, leaving in place a layer of second dielectric between the first electrodes of the CUB capacitors and the sidewalls of the opening that is created in the second layer of dielectric;

depositing a layer of F-poly over the surface of the second electrodes of the CUB capacitors, including the surface of the layer of first dielectric that has been left in place over the sidewalls of the opening created in the second layer of dielectric;

removing the layer of F-poly from the surface of the second electrodes of the CUB capacitors, leaving in place a layer of F-poly over the layer of second dielectric left in place between the first electrodes of the CUB capacitors and the sidewalls of the opening that has been created in the second layer of dielectric;

depositing a layer of LPTEOS over the surface of the second electrodes of the CUB capacitors, including the surface of the layer of F-poly that has been over the sidewalls of the opening created in the second layer of dielectric;

removing the layer of LPTEOS from the surface of the second electrodes of the CUB capacitors, leaving in place a layer of LPTEOS over the layer of F-poly that has been created on the sidewalls of the opening that has been created in the second layer of dielectric;

depositing a layer of D-poly over the surface of the second electrode of said CUB capacitors, filling the opening created in the second layer of dielectric is with D-poly;

removing the layer of D-poly from the surface of the second electrodes of the CUB capacitors, forming a conductive plug through the second layer of dielectric;

removing the layer of LPTEOS from the opening created in the second layer of dielectric;

depositing a layer of PETEOS over the surface of the second electrode of the CUB capacitors, including the surface of the opening created in the second layer of dielectric, closing the opening created in the second layer of dielectric;

polishing the surface of the deposited layer of PETEOS, leaving in place a layer of PETEOS having a measurable thickness over the surface of said second layer of dielectric, including the surface of the opening created in said second layer of dielectric;

patterning the layer of PETEOS, creating an opening in the layer of PETEOS that aligns with the conductive plug formed through the second layer of dielectric;

depositing a layer of metal over the surface of the layer of PETEOS, filling the opening created in the layer of PETEOS with metal;

polishing the layer of metal deposited on the surface of the layer of PETEOS, leaving in place a layer of metal having a measurable thickness over the surface of said layer of PETEOS; and patterning the deposited layer of metal, creating interconnect metal to the bit line of the DRAM cell.

15. The method of claim 14 wherein said depositing first electrode material comprises depositing a layer of HSG.

16. The method of claim 14 wherein said depositing a layer of capacitance dielectric comprises depositing a layer of ONO.

17. The method of claim 14 wherein said depositing second electrode material comprises depositing a layer of polysilicon.

18. The method of claim 14 wherein said removing said F-polysilicon from the surface of said second electrode of said CUB capacitors comprises applying a Reactive Ion Etch (RIE) process.

19. The method of claim 14 wherein said removing said LPTEOS from the surface of said second electrode of said CUB capacitors comprises applying a Reactive Ion Etch (RIE) process.

20. The method of claim 14 wherein said removing said D-polysilicon from the surface of said second electrode of said CUB capacitors comprises applying methods of Chemical Mechanical Polishing.

21. The method of claim 14 wherein said removing said layer of LPTEOS from said opening created in said second layer of dielectric comprises applying wet buffer oxide etching using diluted HF.

* * * * *